United States Patent
Henson

(10) Patent No.: US 9,006,824 B2
(45) Date of Patent: Apr. 14, 2015

(54) POWER SEMICONDUCTOR DEVICE WITH REDUCED ON-RESISTANCE AND INCREASED BREAKDOWN VOLTAGE

(71) Applicant: International Rectifier Corporation, El Segundo, CA (US)

(72) Inventor: Timothy D. Henson, Torrance, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 14/249,725

(22) Filed: Apr. 10, 2014

(65) Prior Publication Data

US 2014/0332879 A1    Nov. 13, 2014

Related U.S. Application Data

(60) Provisional application No. 61/822,808, filed on May 13, 2013.

(51) Int. Cl.
*H01L 29/78* (2006.01)

(52) U.S. Cl.
CPC ........ *H01L 29/7811* (2013.01); *H01L 29/7813* (2013.01)

(58) Field of Classification Search
USPC .......................................... 257/330, 327, 329
See application file for complete search history.

(56) References Cited

U.S. PATENT DOCUMENTS 7,345,342 B2    3/2008    Challa
7,915,672 B2    3/2011    Venkatraman

*Primary Examiner* — Long Pham
(74) *Attorney, Agent, or Firm* — Farjami & Farjami LLP

(57) ABSTRACT

In one implementation, a power semiconductor device includes an active region and a termination region. A depletion trench finger extends from the active region and ends in the termination region. An arched depletion trench surrounds the depletion trench finger in the termination region, the arched depletion trench enables one or both of an increased breakdown voltage and a reduced on-resistance in the power semiconductor device.

20 Claims, 4 Drawing Sheets

POWER SEMICONDUCTOR DEVICE WITH REDUCED ON-RESISTANCE AND INCREASED BREAKDOWN VOLTAGE

The present application claims the benefit of and priority to a provisional application entitled "Semiconductor Device Having an Arched Field Trench," Ser. No. 61/822,808 filed on May 13, 2013. The disclosure in this provisional application is hereby incorporated fully by reference into the present application.

BACKGROUND

Background Art

Group IV power transistors, such as silicon based trench metal-oxide-semiconductor field-effect transistors (trench MOSFETs) are used in a variety of applications. For example, silicon trench MOSFETs may be used to implement a power converter, such as a direct current (DC) to DC power converter. For power MOSFET applications, it is generally desirable to reduce the on-resistance ($R_{dson}$) of the transistor. In addition, it is generally advantageous to have as high a breakdown voltage as is practicable for a desired $R_{dson}$.

The $R_{dson}$ of a trench MOSFET may be reduced by increasing the carrier concentration in a vertical drift region of the MOSFET. In order to protect against voltage breakdown under such conditions, depletion trenches including buried depletion electrodes may be implemented in order to deplete the drift region when the trench MOSFET is in a blocking state. Achievement of a desirably low $R_{dson}$ and a concurrently high breakdown voltage requires that the charge contained in the regions situated adjacent the depletion trenches be consistent and carefully controlled. However, conventional power MOSFETs typically fail to provide the desired control over the charge contained at the MOSFET termination regions.

SUMMARY

The present disclosure is directed to a power semiconductor device with reduced on-resistance and increased breakdown voltage, substantially as shown in and/or described in connection with at least one of the figures, and as set forth more completely in the claims.

DETAILED DESCRIPTION

Figure 1:
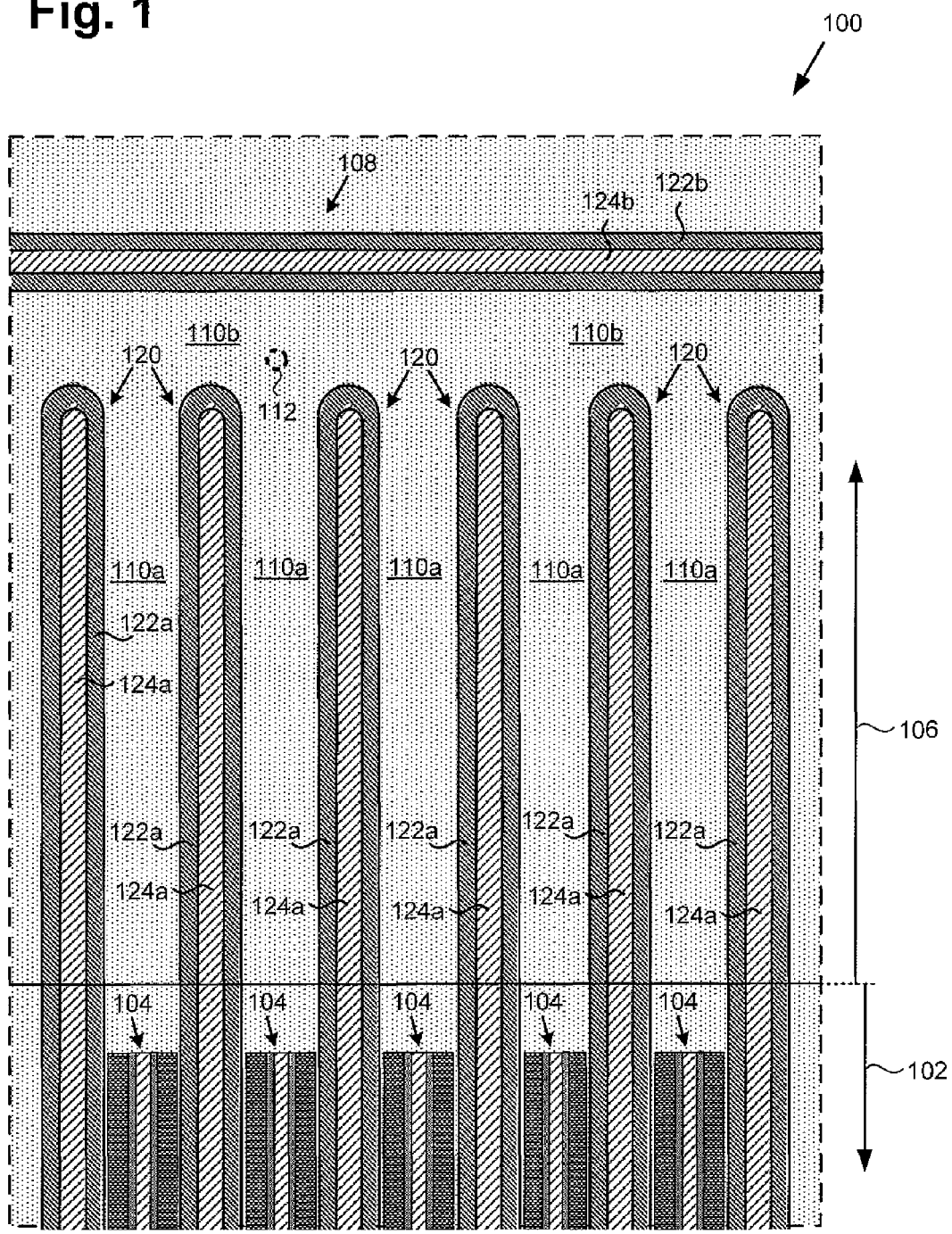
FIG. 1 is a top view of a portion of a power MOSFET showing a conventional device termination layout.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, group IV power transistors, such as silicon based trench metal-oxide-semiconductor field-effect transistors (trench MOSFETs) are used in a variety of applications. For example, silicon trench MOSFETs may be used to implement a power converter, such as a direct current (DC) to DC power converter. For most MOSFET applications, it is desirable to reduce the on-resistance ($R_{dson}$) of the transistor. In addition, it is generally advantageous to have as high a breakdown voltage as is practicable for a desired $R_{dson}$.

The $R_{dson}$ of a trench MOSFET may be reduced by increasing the carrier concentration in a vertical drift region of the MOSFET. In order to protect against voltage breakdown under such conditions, depletion trenches including buried depletion electrodes may be implemented in order to deplete the drift region when the trench MOSFET is in a blocking state. Achievement of a desirably low $R_{dson}$ and a concurrently high breakdown voltage requires that the charge contained in the regions situated adjacent the depletion trenches be consistent and carefully controlled. However, as noted above, conventional device layouts typically fail to provide the desired control over the charge contained in the semiconductor regions at the device termination.

FIG. 1 is a top view of a portion of a semiconductor device showing a conventional device termination layout. Semiconductor device 100 may be a trench power MOSFET, for example. As shown in FIG. 1, semiconductor device 100 includes active region 102 and termination region 106. As further shown in FIG. 1, active region 102 includes semiconductor device unit cells 104, which may be trench MOSFET unit cells, for example.

Termination region 106 is shown to include boundary trench 108 and depletion trench fingers 120 extending from active region 102 toward boundary trench 108. Termination region 106 also includes semiconductor mesa regions 110a situated between the sides of adjacent depletion trench fingers 120, as well as semiconductor mesa regions 110b situated between the tips of depletion trench fingers 120 and boundary trench 108.

Each of depletion trench fingers 120 includes vertical field plate or buried depletion electrode 124a and trench oxide 122a disposed between buried depletion electrode 124a and semiconductor mesa regions 110a and 110b. Boundary trench 108 includes vertical field plate or buried depletion electrode 124b and trench oxide 122b disposed between buried depletion electrode 124b and semiconductor mesa regions 110b. Also shown in FIG. 1 is an exemplary termination zone 112 in semiconductor mesa region 110b.

In order to provide a trench MOSFET having a desirably low $R_{dson}$ while concurrently exhibiting an advantageously high breakdown voltage, the charge contained in semiconductor mesa regions 110a and 110b should be consistent and carefully controlled. That is to say, the charge present in semiconductor mesa regions 110a and 110b should be such that the depletion effect produced by buried depletion electrodes 124a and 124b is sufficient to protect against voltage breakdown throughout semiconductor mesa regions 110a and 110b when semiconductor device 100 is in a blocking state.

In semiconductor mesa regions 110a, charge may be controlled by utilizing a layout in which depletion trench fingers 120 are arranged substantially in parallel, with a substantially uniform distance between the sides of adjacent parallel trenches, as shown in FIG. 1. Such a layout assures that the charge contained in semiconductor mesa regions 110a is consistent along the lengths of depletion trench fingers 120, and experiences substantially similar depletion by two neighboring buried depletion electrodes 124a in depletion trench fingers 120. In other words, the electric field produced in semiconductor mesa regions 110a can be well characterized and well controlled.

In contrast to the conditions experienced by semiconductor mesa regions 110a, the layout of termination region 106 dictates that the charge contained in termination zone 112 of semiconductor mesa region 110b experiences depletion from three, relatively more distant depletion sources, i.e., buried depletion electrodes 124a at the tips of adjacent depletion trench fingers 120, and buried depletion electrode 124b in boundary trench 108. As a result, the electric field produced in termination zone 112, as well as semiconductor mesa regions 110b as a whole, is less certain, and thus less well controlled than that produced in semiconductor mesa region 110a. Consequently, semiconductor device 100 having the conventional device termination layout shown in FIG. 1 may be susceptible to voltage breakdown in semiconductor mesa regions 110b.

Figure 2:
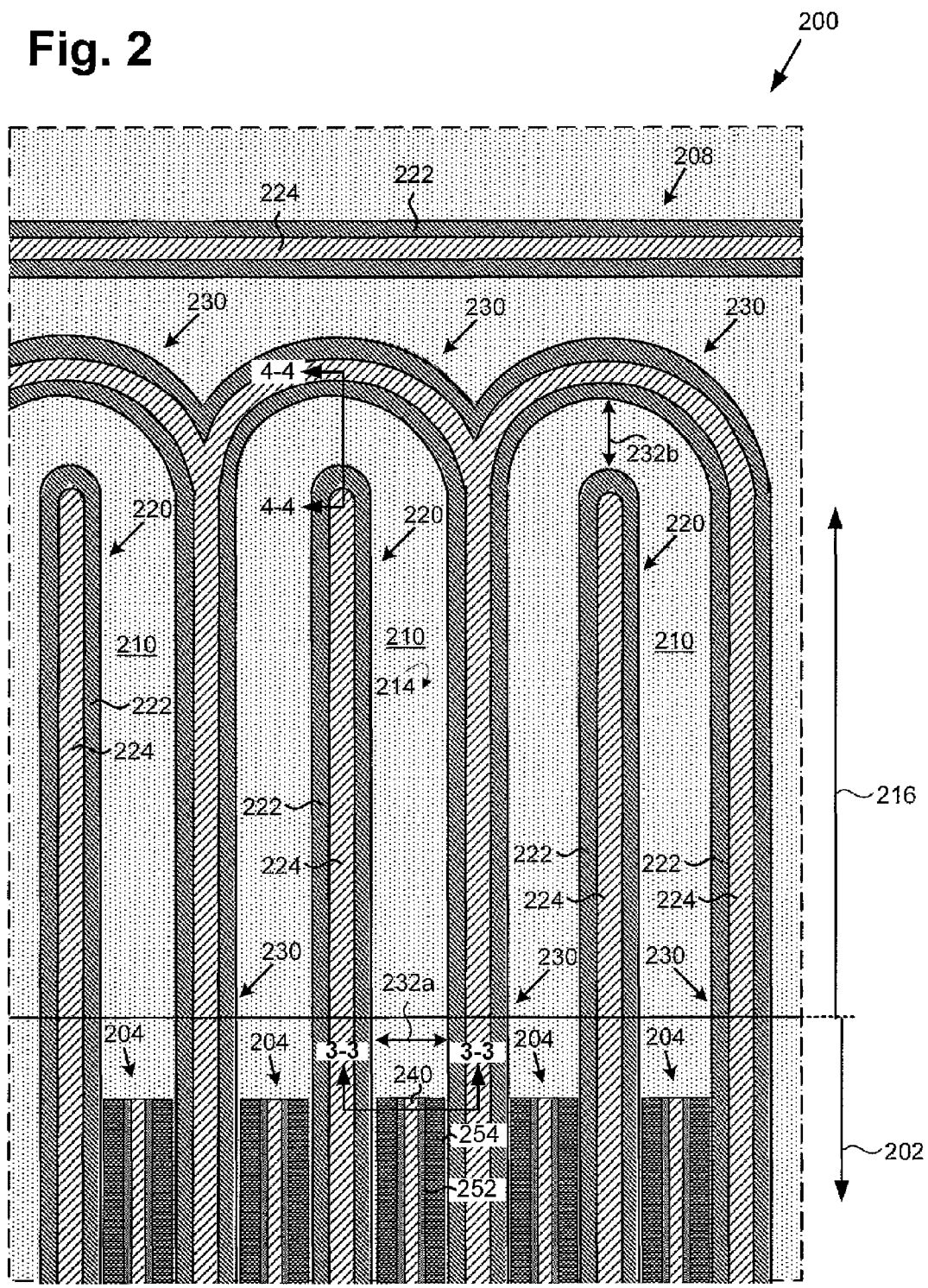
FIG. 2 is a top view of a portion of an exemplary power MOSFET having an arched depletion trench, according to one implementation of the present disclosure.

The present application discloses a semiconductor device having an arched depletion trench providing enhanced resistance to voltage breakdown for a particular $R_{dson}$. FIG. 2 shows a top view of an exemplary implementation of such a device. Semiconductor device 200 includes active region 202 and termination region 216. Semiconductor device 200 may be a power MOSFET, for example, such as a trench MOSFET including trench MOSFET unit cells 204 formed in active region 202. According to the implementation shown in FIG. 2, each of trench MOSFET unit cells 204 includes gate 240, source regions 252, and channel contacts 254, formed at surface 214 of semiconductor mesa regions 210 in active region 202.

As shown in FIG. 2, depletion trench fingers 220 extend from active region 202 and end in termination region 216. Also shown in FIG. 2 is arched depletion trench 230 also extending from active region 202 into termination region 216 and surrounding depletion trench fingers 220 in termination region 216. Depletion trench fingers 220 and arched depletion trench 230 each includes vertical field plate or buried depletion electrode 224 and trench dielectric 222 disposed between buried depletion electrode 224 and semiconductor mesa regions 210. In addition, FIG. 2 shows optional boundary trench 208 including buried depletion electrode 224 and trench dielectric 222.

It is noted that although semiconductor device 200 will be described as a midvoltage (MV) silicon trench MOSFET in the interests of conceptual clarity, the termination layout disclosed in FIG. 2 may be implemented for use with a variety of semiconductor device types. Thus, in other implementations, semiconductor device 200 may correspond to any one of a variety of power semiconductor devices. For example, in another implementation, semiconductor device 200 may take the form of a group IV insulated-gate bipolar transistor (IGBT) or diode, for example, or a group III-V transistor or diode, such as a III-Nitride transistor or diode. Moreover, the termination layout disclosed by the present application may be readily adapted for use in a low voltage (LV) or high voltage (HV) group IV or group III-V device.

As used herein, the phrase "group IV" refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layer of group IV elements, or doping of group IV elements to produce strained group IV materials, and may also include group IV based composite substrates such as silicon on insulator (SOI), separation by implantation of oxygen (SIMOX) process substrates, and silicon on sapphire (SOS), for example.

In addition, the expression LV in reference to a transistor or switch describes a transistor or switch with a voltage range of up to approximately forty volts (40V), while use of MV refers to a voltage range from approximately forty volts to approximately two hundred volts (approximately 40V to 200V). Moreover, the expression HV refers to a voltage range from approximately two hundred volts to approximately twelve hundred volts (approximately 200V to 1200V), or higher.

As used herein, the phrase "group III-V" refers to a compound semiconductor including at least one group III element and at least one group V element. By way of example, a group III-V semiconductor may take the form of a III-Nitride semiconductor that includes nitrogen and at least one group III element. For instance, a III-Nitride power transistor may be fabricated using gallium nitride (GaN), in which the group III element or elements include some or a substantial amount of gallium, but may also include other group III elements in addition to gallium.

Continuing to refer to FIG. 2, distance 232a is shown to extend between the sides of depletion trench fingers 220 and arched depletion trench 230 in active region 202, while distance 232b extends between the tips of depletion trench fingers 220 and arched depletion trench 230 in termination region 216. As shown by the implementation in FIG. 2, distances 232a and 232b may be similar or substantially equal. For example, distance 232a may vary by less than approximately twenty percent (20%) from distance 232b, such as by approximately fifteen percent (15%), or less.

As a more specific example, where semiconductor device 200 is implemented as an approximately one hundred volt (100 V) silicon trench MOSFET, distance 232a may be approximately 1.4 micrometers (1.4 μm), while distance 232b may be approximately 1.2 μm. As a result, the charge contained in semiconductor mesa regions 210 is consistent throughout termination region 216. Moreover, semiconductor mesa regions 210 are bordered along their entirety by two symmetrically arranged buried depletion electrodes 224, resulting in a substantially similar depletion profile throughout termination region 216 when semiconductor device 200 is in a blocking state.

Consequently, the termination layout including arched termination trench 230 shown in FIG. 2 enables one or more of an increased breakdown voltage and a reduced $R_{dson}$ for semiconductor device 200. For example, semiconductor device 200 can be configured to have an $R_{dson}$ close to the theoretical limit for that device without being at significant risk of voltage breakdown in termination region 216.

It is noted that although FIG. 2 shows only a portion of semiconductor device 200, the layout geometry represented in that figure can be symmetrical with respect to active region 202. In other words, depletion trench fingers 220 and arched depletion trench 230 may extend through active region 202 and emerge below active region 202 as a mirror image of the termination region layout shown in FIG. 2. As a result, each of depletion trench fingers 220 may be formed as an island depletion trench finger 220 surrounded by semiconductor mesa regions 210 and arched depletion trench 230. Moreover, and as noted above, arched depletion trench 230 may be a single continuous trench having multiple adjoining cells, each cell surrounding one of island depletion trench fingers 220. Furthermore, it is reiterated that distances 232a and 232b may be substantially equal, so that each cell of continuous arched depletion trench 230 may include semiconductor mesa region 210 having an elongated racetrack layout with substantially constant width.

Figure 3:
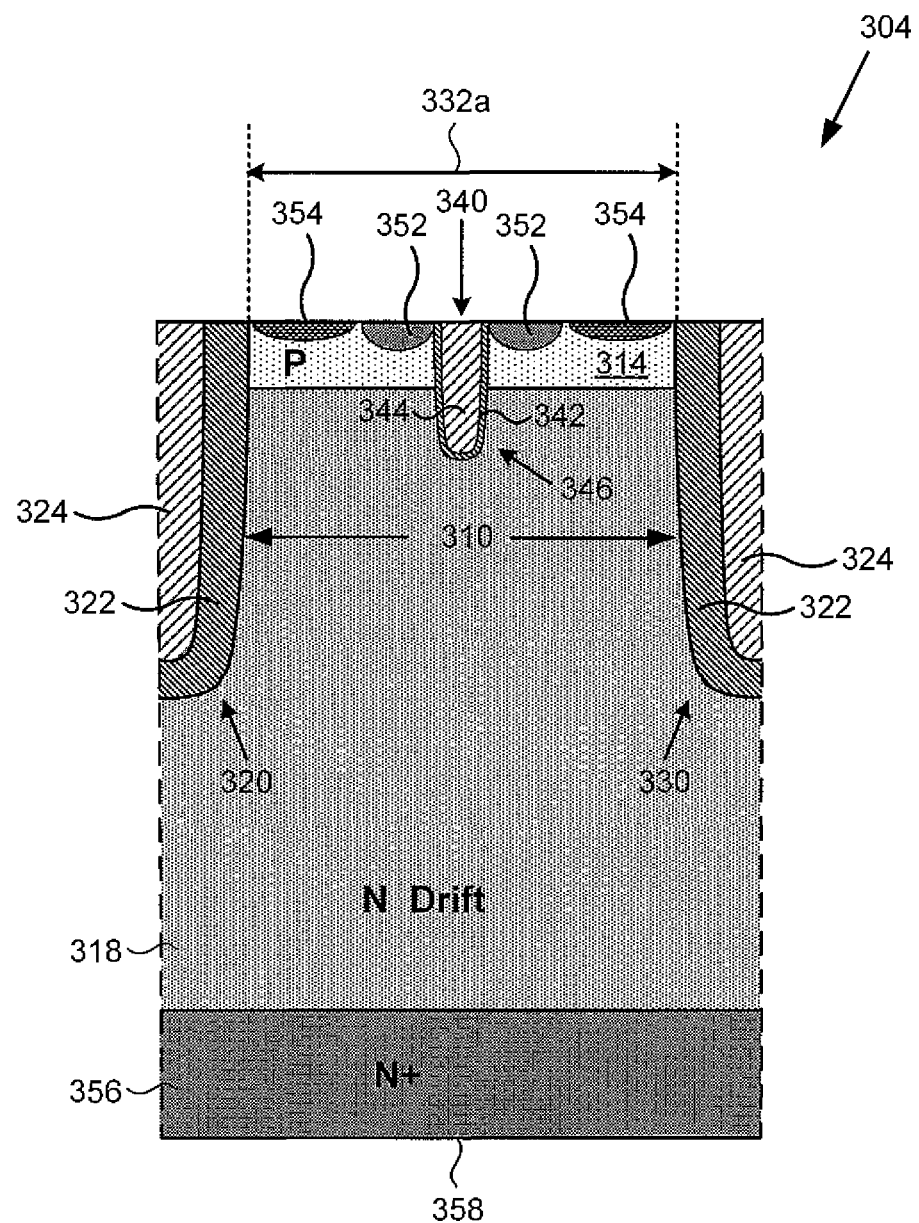
FIG. 3 shows a cross-sectional view of an active region of the exemplary power MOSFET in FIG. 2, according to one implementation of the present disclosure.

Referring now to FIG. 3, FIG. 3 shows a cross-sectional view of trench MOSFET unit cell 204 in active region 202 of semiconductor device 200, in FIG. 2, in the direction of perspective lines 3-3 in that figure. As shown in FIG. 3, trench MOSFET unit cell 304 includes conductive substrate 356, shown as an N+ substrate, and N type drift region 318 situated over conductive substrate 356. Conductive substrate 356 may be a silicon substrate, for example, and may include N type drift region 318 formed in an epitaxial silicon layer disposed over conductive substrate 356. Formation of an epitaxial silicon layer may be performed by any suitable method, as known in the art, such as chemical vapor deposition (CVD) or molecular beam epitaxy (MBE), for example.

More generally, however, N type drift region 318 may be formed in any suitable group IV layer included in trench MOSFET unit cell 304. Thus, in other implementations, N type drift region 318 need not be formed of silicon. For example, in one alternative implementation, N type drift region 318 can be formed in either a strained or unstrained germanium layer formed over conductive substrate 356. Moreover, in some implementations, trench MOSFET unit cell 304 may include additional layers, such as an N type buffer or field stop layer situated between conductive substrate 356 and N type drift region 318 (buffer or field stop layer not shown in FIG. 3).

Trench MOSFET unit cell 304 also includes P type channel layer 314, gate 340 including gate dielectric 342 and gate electrode 344 formed in gate trench 346, N type source regions 352 adjacent gate trench 346, P type channel contacts 354, and drain 358 provided by conductive substrate 356. P type channel layer 314 is formed over N type drift region 318, which in turn is formed over conductive substrate 356. It is noted that P type channel layer 314 and P type channel contacts 354 may be formed through implantation and diffusion of a P type dopant, such as boron (B) in a top surface of N type drift region 318. Moreover, N type source regions 352 may be formed through implantation and diffusion of an N type dopant, such as phosphorus (P) or arsenic (AS), for example.

Also shown in FIG. 3 are depletion trench finger 320 and arched depletion trench 330, each including buried depletion electrode 324 and trench dielectric 322, as well as semiconductor mesa region 310, and distance 332a extending between the side of depletion trench finger 320 and arched depletion trench 330. Depletion trench finger 320, arched depletion trench 330, buried depletion electrodes 324, and trench dielectric 322 correspond respectively to depletion trench fingers 220, arched depletion trench 230, buried depletion electrodes 224, and trench dielectric 222, in FIG. 2. In addition, semiconductor mesa region 310, P type channel layer 314, gate 340, N type source regions 352, P type channel contacts 354, and distance 332a, in FIG. 3, correspond respectively to semiconductor mesa region 210, surface 214, gate 240, source regions 252, channel contacts 254, and distance 232a, in FIG. 2.

Gate dielectric 342 and trench dielectric 322 may be formed using any material and any technique typically employed in the art. For example, gate dielectric 342 and trench dielectric 322 may be formed of a gate oxide, such as silicon oxide ($SiO_2$), for example, and may be deposited or thermally grown to produce gate dielectric 342 and trench dielectric 322. Gate electrode 344 and buried depletion electrodes 324 may also be formed using any material typically utilized in the art. For example, gate electrode 344 and buried depletion electrodes 324 may be formed of conductive polysilicon.

As shown in FIG. 3, the trenches used to form depletion trench finger 320 and arched depletion trench 330 extend from the surface of P type channel layer 314 into N type drift region 318, and are substantially deeper than gate trench 346. For example, in some implementations, the trenches used to form depletion trench finger 320 and arched depletion trench 330 may be approximately 5-6 µm deep, while gate trench 346 may be approximately 1.0 µm deep, or less. It is reiterated that the features depicted in FIG. 3 are shown for conceptual clarity and are not drawn to scale.

It is also noted that trench MOSFET unit cell 304 is merely an exemplary representation, and in other implementations, trench MOSFET unit cell 304 may include different features, or may include similar features configured differently. For example, one of ordinary skill in the art will readily recognize that in other implementations of a group IV trench MOSFET, gate electrode 344 and one of buried depletion electrodes 324 may be disposed in the same deep trench, such as the trench providing depletion trench finger 320, with gate electrode 344 disposed over and electrically isolated from buried depletion electrode 324. In such an implementation, P type channel contacts 354 and N type source regions 352 may be situated adjacent the deep trench providing depletion trench finger 320, at the surface of P type channel layer 314.

Buried depletion electrodes 324 can be used to deplete semiconductor mesa region 310 of N type drift region 318 when the trench MOSFET including trench MOSFET unit cell 304 is in the blocking state, when buried depletion electrodes 324 are tied to a low electrical potential, e.g., grounded or at a near ground potential. For example, in one implementation, buried depletion electrodes 324 may be electrically shorted to N type source regions 352 by a metallization layer formed over the active region including trench MOSFET unit cell 304, or by any other technique known in the art.

As noted above, use of buried depletion electrodes 324 to deplete semiconductor mesa region 310 of N type drift region 318 confers several possible advantages. For example, in one implementation, depletion trench finger 320 and arched depletion trench 330 including buried depletion electrodes 324 enable the semiconductor device having unit cell 304 to sustain a higher breakdown voltage for higher voltage operation. Alternatively, or in addition, depletion trench finger 320 and arched depletion trench 330 including buried depletion electrodes 324 can enable an increased conductivity for N type drift region 318 while sustaining a desired breakdown voltage. The latter implementation may be desirable because increased conductivity in semiconductor mesa region 310 of N type drift region 318 is associated with a reduced $R_{dson}$ for the semiconductor device having unit cell 304.

Figure 4:
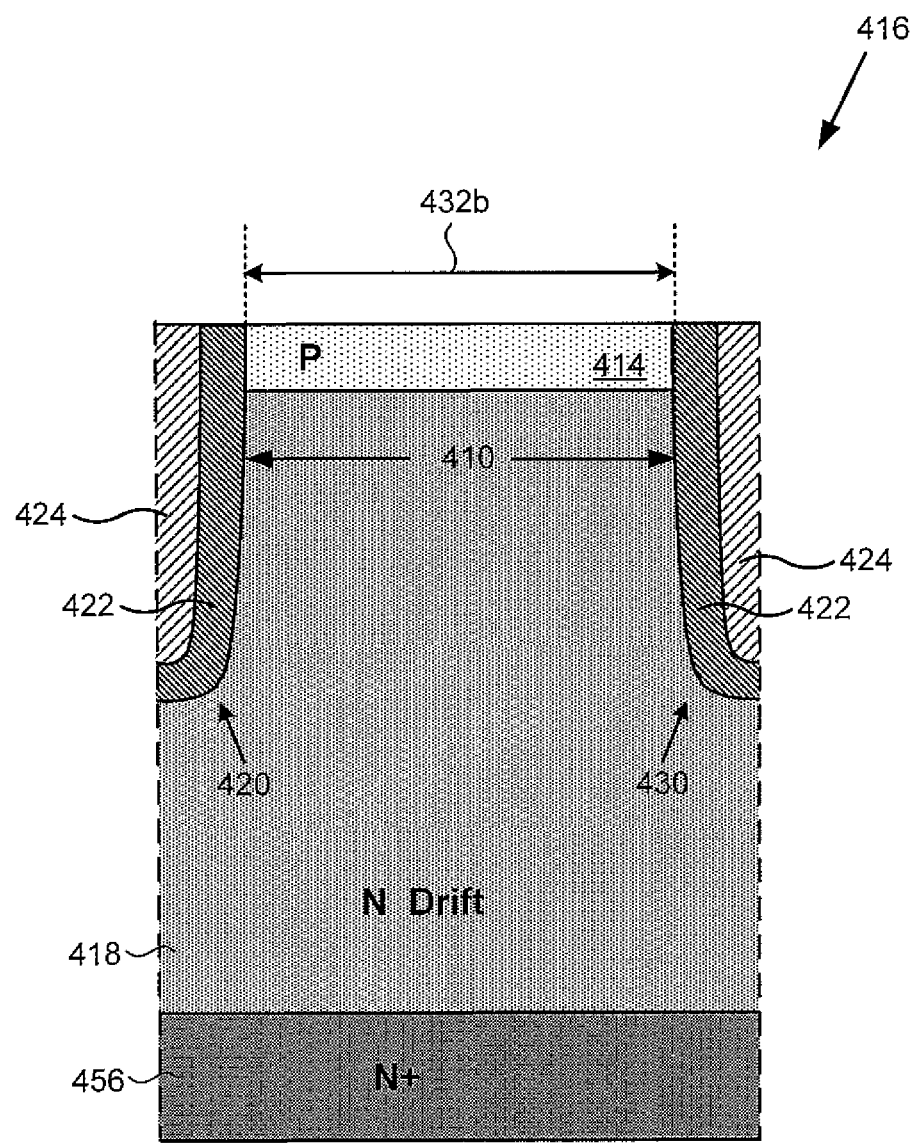
FIG. 4 shows a cross-sectional view of a termination region of the exemplary power MOSFET in FIG. 2, according to one implementation of the present disclosure.

Continuing to FIG. 4, FIG. 4 shows a cross-sectional view of termination region 216, in FIG. 2, in the direction of perspective lines 4-4 in that figure. As shown in FIG. 4, termination region 416 includes conductive substrate 456, shown as an exemplary N+ conductive substrate, and N type drift region 418 situated over conductive substrate 456. Termination region 416 also includes depletion trench finger 420 and arched depletion trench 430 each including buried depletion electrode 424 and trench dielectric 422, as well as P type layer 414, semiconductor mesa region 410, and distance 432b between the tip of depletion trench finger 420 and arched depletion trench 430. Depletion trench finger 420, arched depletion trench 430, buried depletion electrodes 424, and trench dielectric 422 correspond respectively to depletion trench fingers 220, arched depletion trench 230, buried depletion electrodes 224, and trench dielectric 222, in FIG. 2. In addition, semiconductor mesa region 410, distance 432b, and P type layer 414, in FIG. 4, correspond respectively to semiconductor mesa region 210, distance 232b, and surface 214, in FIG. 2.

Buried depletion electrodes 424 can be used to deplete semiconductor mesa region 410 of drift region 418 when the trench MOSFET having termination region 416, is in the blocking state and buried depletion electrodes 424 are tied to a low electrical potential, e.g., grounded or at a near ground potential. Moreover, because distance 432b/232b of between the tip of depletion trench finger 420/220 and the arched portion of arched depletion trench 430/230 is similar to or substantially the same as distance 332a/232a, the depletion of semiconductor mesa region 410/310/210 is well characterized and consistent in both active region 302/202 and termination region 416/216.

Thus, a power semiconductor device, such as a power MOSFET, having a termination layout including an arched depletion trench as disclosed herein, can sustain a higher breakdown voltage for a higher voltage operation. Alternatively, or in addition, the termination layout including the arched depletion trench 230 enables a reduced $R_{dson}$ in the semiconductor device, while sustaining a desired breakdown voltage. In some implementations, the power semiconductor device may take the form of a group IV IGBT or diode, for example, having a reduced on-resistance and/or an increased breakdown voltage. In other implementations, the power semiconductor device may take the form of a group III-V transistor or diode, such as a III-Nitride transistor or diode having a reduced on-resistance and/or an increased breakdown voltage. Moreover, and as noted above, the termination layout disclosed by the present application may be readily adapted for use in an LV, MV, or HV group IV or group III-V device. In addition, the termination layout including the arched depletion trench disclosed herein enables a compact design for the semiconductor device and may be implemented without the need for additional masks or processing steps during fabrication of the semiconductor device.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A power semiconductor device comprising:
an active region and a termination region;
a depletion trench finger extending from said active region and ending in said termination region;
an arched depletion trench surrounding said depletion trench finger in said termination region, wherein said arched depletion trench enables at least one of an increased breakdown voltage and a reduced on-resistance in said power semiconductor device.

2. The power semiconductor device of claim 1, wherein a first distance between a side of said depletion trench finger and said arched depletion trench in said active region varies by less than approximately twenty percent (20%) from a second distance between a tip of said depletion trench finger and said arched depletion trench in said termination region.

3. The power semiconductor device of claim 1, wherein said power semiconductor device comprises a plurality of depletion trench fingers including said depletion trench finger, said arched depletion trench being a continuous trench configured to surround each of said plurality of depletion trench fingers.

4. The power semiconductor device of claim 1, wherein said power semiconductor device is a group IV power semiconductor device.

5. The power semiconductor device of claim 1, wherein said depletion trench finger and said arched depletion trench include respective buried depletion electrodes disposed therein.

6. The power semiconductor device of claim 1, wherein said power semiconductor device is a power MOSFET.

7. The power semiconductor device of claim 6, wherein said power MOSFET comprises a conductive substrate having a first conductivity type, a drift region having said first conductivity type formed over said conductive substrate, and a channel layer having a second conductivity type formed over said drift region.

8. The power semiconductor device of claim 6, wherein said depletion trench finger and said arched depletion trench extend from a surface of a channel layer having a second conductivity type into a drift region having a first conductivity type.

9. The power semiconductor device of claim 6, wherein said power MOSFET is a silicon MOSFET having a gate trench, a source, and a drain formed in said active region.

10. The power semiconductor device of claim 9, wherein each of said depletion trench finger and said arched depletion trench is substantially deeper than said gate trench.

11. The power semiconductor device of 9, wherein each of said depletion trench finger and said arched depletion trench includes a respective buried depletion electrode, each of said respective buried depletion electrodes being shorted to said source.

12. A power semiconductor device comprising:
an active region and a termination region;
a depletion trench finger extending from said active region and ending in said termination region;
an arched depletion trench surrounding said depletion trench finger in said termination region;
wherein a first distance between a side of said depletion trench finger and said arched depletion trench in said active region is substantially equal to a second distance between a tip of said depletion trench finger and said arched depletion trench in said termination region.

13. The power semiconductor device of claim 12, wherein said power semiconductor device comprises a plurality of depletion trench fingers including said depletion trench finger, said arched depletion trench being a continuous trench configured to surround each of said plurality of depletion trench fingers.

14. The power semiconductor device of claim 12, wherein said power semiconductor device is a group IV power semiconductor device.

15. The power semiconductor device of claim 12, wherein said depletion trench finger and said arched depletion trench include respective buried depletion electrodes disposed therein.

16. The power semiconductor device of claim 12, wherein said power semiconductor device is a power MOSFET.

17. The power semiconductor device of claim 12, wherein said power semiconductor device comprises a conductive substrate having a first conductivity type, a drift region having said first conductivity type formed over said conductive substrate, and a channel layer having a second conductivity type formed over said drift region.

18. The power semiconductor device of claim 12, wherein said power semiconductor device is a silicon MOSFET having a gate trench, a source, and a drain formed in said active region.

19. The power semiconductor device of 18, wherein each of said depletion trench finger and said arched depletion trench includes a respective buried depletion electrode disposed therein, each of said respective buried depletion electrodes being shorted to said source.

20. The power semiconductor device of claim 18, wherein each of said depletion trench finger and said arched depletion trench is substantially deeper than said gate trench.

* * * * *